United States Patent [19]
Eden

[11] Patent Number: 5,300,810
[45] Date of Patent: Apr. 5, 1994

[54] ELECTRONIC CIRCUIT AND METHOD WITH THERMAL MANAGEMENT

[75] Inventor: Richard C. Eden, Thousand Oaks, Calif.

[73] Assignee: Norton Company, Worcester, Mass.

[21] Appl. No.: 930,482

[22] Filed: Aug. 14, 1992

Related U.S. Application Data

[63] Continuation of Ser. No. 592,209, Oct. 3, 1990.

[51] Int. Cl.[5] .................... H01L 23/16; H01L 25/04
[52] U.S. Cl. ................................ 257/686; 257/714; 257/717; 257/746
[58] Field of Search ............... 357/74, 75, 80, 81; 361/385; 257/714, 715, 716, 717, 746, 686, 685

[56] References Cited

U.S. PATENT DOCUMENTS

| | | | |
|---|---|---|---|
| 4,471,003 | 9/1984 | Cann | 427/34 |
| 4,487,162 | 12/1984 | Cann | 118/723 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,762,174 | 8/1988 | Artus | 165/185 |
| 4,800,002 | 1/1989 | Peters | 204/15 |
| 4,862,249 | 8/1989 | Carlson | 357/80 |
| 4,953,005 | 8/1990 | Carlson et al. | 357/80 |
| 4,956,746 | 9/1990 | Gates, Jr. et al. | 361/385 |
| 4,991,000 | 2/1991 | Bone et al. | 357/75 |
| 5,032,896 | 7/1991 | Little et al. | 357/75 |

FOREIGN PATENT DOCUMENTS

| | | | |
|---|---|---|---|
| 58-147049 | 9/1983 | Japan | 357/81 |
| 2-023639 | 1/1990 | Japan | 257/686 |

OTHER PUBLICATIONS

B. V. Spitzyn, L. L. Boulov, and B. V. Derjaguin, "Diamond And Diamond-Like Films: Deposition From The Vapor Phase, Structure And Properties", Progress in Crystal Growth and Characterization 17, pp. 79–170 (1988).

P. D. Gigl, "New Synthesis Techniques, Properties, And Applications For Industrial Diamond", IDA Ultrahard Materials Seminar, Toronto, Canada (Sep., 1989).

Proceedings of the "First International Symposium on Diamond and Diamond-Like Films", The Electrochemical Society, Pennington, N.J., Proceedings vol. 89–12 (1989).

(List continued on next page.)

Primary Examiner—Jerome Jackson
Assistant Examiner—D. Monin
Attorney, Agent, or Firm—Volker R. Ulbrich; Martin M. Novack

[57] ABSTRACT

The disclosure is directed to an improved circuit and method which utilizes a plurality of generally planar diamond substrate layers. Electronic circuit elements are mounted on each of the substrate layers, and the substrate layers are disposed in a stack. Heat exchange means can be coupled generally at the edges of the substrate layers. In a disclosed embodiment, a multiplicity of generally planar diamond substrate layers and a multiplicity of generally planar spacer boards are provided. Each of the substrate layers has mounted thereon a multiplicity of electronic elements and conductive means for coupling between electronic elements. In general, at least some of the electronic elements on the substrate layers comprise integrated circuit chips. The substrate layers and spacer boards are stacked in alternating fashion so that spacer boards are interleaved between adjacent substrate layers. Each of the spacer boards has a multiplicity of electrical conductors extending through its planar thickness to effect coupling between electronic components on the substrate layers on its opposing sides. The extremely high thermal conductivity of diamond permits adequate heat removal from the defined three-dimensional circuit structure by heat exchange means that do not substantially interfere with electronic element density, with vertical interconnect density, or with the desire for small physical size.

40 Claims, 13 Drawing Sheets

OTHER PUBLICATIONS

P. K. Bachmann, R. Messler, "Emerging Technology of Diamond Thin Films", C&EN, May 15, 1989.

"Diamond And Diamond-Like Coatings: A Techno-Economic Assessment", Gorham Advanced Materials Institute, vol. 1, title page and pp. 5-22-5-40.

R. Smolley, "Button Board, A New Technology Interconnect For 2 and 3 Dimensional Packaging", International Society For Hybrid Microelectronics, Anaheim, California (Nov. 1985).

R. Smolley, "Connectorless High Speed Interconnect", Government Microcircuit Applications Conference, Orlando, Florida (Oct., 1987).

"Silicon On Insulator Technology Using CVD Diamond Films", K. V. Ravi and M. I. Landstrass, Proceedings of the First International Symposium on Diamond and Diamond-Like Films, The Electrochemical Society, Pennington, N.J., Proceedings vol. 89-12, pp. 24-37 (1989).

"The Impact Of Deposition Parameters On The Thermal Conductivity Of CVD Diamond Films", Proceedings of the First International Symposium on Diamond and Diamond-Like Films, The Electrochemical Society, Pennington, N.J., Proceedings vol. 89-12, pp. 366-379 (1989).

ELECTRONIC CIRCUIT AND METHOD WITH THERMAL MANAGEMENT

This is a continuation of U.S. application Ser. No. 592,209, filed Oct. 3, 1990.

FIELD OF THE INVENTION

This invention relates to electronic circuits and the thermal management thereof and also relates to the packaging, interconnection and thermal management of electronic systems, subsystems, or modules having a high density of integrated circuits or other devices.

BACKGROUND OF THE INVENTION

The VLSI (very large scale integration) circuits used in computers and other electronic systems or subsystems typically employ a large number of circuit elements. [As used herein, "circuit elements" is intended to generically include active as well as passive devices or components of any kind used in electronic or electro-optical applications.] VLSI circuits may at present have many thousands to over a million transistors on a single die, the semiconductor chip from which the circuit is fabricated, and a computer system may have large numbers of such chips. The technology continues to move in the direction of increasing device density for primarily two interrelated reasons. One is the need to reduce the size of the circuits in order to permit increased complexity for a given machine size with reduced manufacturing cost and power requirements. The other is the need to increase the operating speeds. The electromagnetic propagation delay or transit time of signals traveling within the machine between circuit elements, and particularly between different integrated circuits, is a significant factor in limiting the operating speed. Therefore, it is desirable that integrated circuit chips of a machine which communicate with one another be placed as closely together as possible.

A serious constraint in the increase of packing density of integrated circuits is their thermal management; i.e., the ability to effectively carry away the heat generated by the electronic components. The density of heat generating devices and their operating frequency (since the power dissipation of some types of circuits increases with frequency) both contribute to the problem of heat generation. In the 2-dimensional case, to make the interconnect propagation delays a constant fraction of a clock cycle, the power density tends to increase as the cube of the operating clock frequency. If the high power densities are not counterbalanced by improved heat removal, higher device operating temperatures will result which will drastically increase the failure rate of electronic integrated circuits or, if high enough, cause the circuits to be inoperative, or even cause permanent destruction of the circuit. In general, the build-up of heat can be controlled by incorporating a high thermal conductance, called a heat sink, between the integrated circuit chips and some cooling medium suited to the demands of the particular application. The cooling medium may be air, water, a common refrigerant, or even liquid nitrogen. It is possible to incorporate the heat sink within the circuit board or substrate material on which the circuit chips are mounted in some applications, providing the heat sink material is good enough to effectively support the lateral heat flow through the substrate. The effectiveness of the heat sink is a function of the thermal conductivity of the heat sink material, so materials of high thermal conductivity are preferred for use as heat sinks. Diamond has the highest thermal conductivity (k=2000 W/m degree K. at 300 degrees K.) of any known material. Silver, copper and aluminum (with k=430, 400 and 240, respectively at 300 degrees K.) are among the best cheaper alternative heat sink materials, but are electrical conductors, requiring special electrical insulating steps if isolated conductors must be passed through the material, compromising the thermal conductance. Also, silver and copper (which are better thermal conductors than aluminum) are much heavier per unit volume than diamond. A further advantage of diamond is that its thermal expansion coefficient is a better match to that of silicon than most other heat sinking materials. Diamond has been suggested and used as a heat sink material for electronic devices and circuits because of its superior thermal conductivity and insulating properties, but its practical use has been limited by its cost/benefit ratio in circuit applications where alternative heat sinking materials may be more readily provided in the necessary sizes and shapes, and where such alternate materials are operationally adequate.

In recent years it has been demonstrated that there can be great advantages in a 3-dimensional interconnected packaging approach, wherein a number of 2-dimensional circuit boards (each typically containing many chips) are stacked vertically and wherein, instead of being edge connected, vertical interconnects between the boards are provided and are distributed over the area of the boards. Such an approach has the advantage of reducing the maximum path lengths and electromagnetic propagation delays of the signal interconnection lines in the overall circuit and in greatly reducing the critical path delays for signals among smaller groups of chips implementing key functions, as well as generally making available much higher levels of system connectivity. Notwithstanding these advantages, a serious problem of the 3-dimensional interconnect packaging approach is the amount of heat that builds up as a consequence of the high density of devices and the smaller external surface area per unit volume or per integrated circuit of the 3-dimensional package. Sophisticated heat removal techniques, including the pumping of cooling fluid through a number of paths in the structure and/or immersion of the structure in a refrigerant which may be pumped through the structure, are expensive and/or inconvenient, particularly due to the presence of the conductive vertical interconnects between boards which tends to block the spaces between the boards that would otherwise be available as flow paths for the cooling fluid (e.g., air, fluorinert, etc.).

It is among the objects of the present invention to provide improved electronic circuit fabrication, interconnection, packaging, and thermal management which is responsive to the described problems and limitations of the prior art.

SUMMARY OF THE INVENTION

The present invention is directed to an improved circuit and method which utilizes a plurality of generally planar diamond substrate layers. Electronic circuit elements are mounted on each of the substrate layers, and the substrate layers are disposed in a stack. Heat exchange means can be coupled generally at the edges of the substrate layers.

As used herein, "diamond" is intended to mean natural or synthetic diamond or diamond-like substances having a thermal conductivity of the order of the thermal conductivity of diamond. Also, reference to "mounted on" is intended to include mounted in or in intimate thermal contact with a substrate layer.

In a particular preferred embodiment of the circuit of the invention, a multiplicity of generally planar diamond substrate layers and a multiplicity of generally planar spacer boards are provided. Each of the substrate layers has mounted thereon a multiplicity of electronic elements and conductive means for coupling between electronic elements. In general, at least some of the electronic elements on the substrate layers comprise integrated circuit chips. The substrate layers and spacer boards are stacked in alternating fashion so that spacer boards are interleaved between adjacent substrate layers. Each of the spacer boards has a multiplicity of electrical conductors extending through its planar thickness to effect coupling between electronic components on the substrate layers on its opposing sides.

In a described embodiment hereof, the spacer boards are formed of an insulating material with a multiplicity of holes through their planar thickness and conductors placed in selected ones of the holes to effect electrical coupling between electrical elements on the substrate layers on opposing sides of each spacer board. In this embodiment, integrated circuit chips are mounted on one side of said substrate layers, and alternating layers of conductors and insulator are disposed on the other side of the substrate layers, at least some of said conductors being coupled with the integrated circuit chips by conductive vias passing through the substrate layers.

A number of advantages accrue from the invention. Electronic circuit elements, particularly integrated circuit semiconductor chips, can be packed with very high volume density in an area-interconnected multilayer structure and can operate at a very high frequency because of the close physical proximity of the chips and short interconnect lengths between them. Both of these factors might normally result in heating problems for such 3-dimensionally interconnected structures that have been solved, if at all, in the prior art with cooling techniques that may suffer one or more of the following disadvantages: the need for immersion of the structure; the use of expensive, inconvenient, or dangerous coolant media; and the need for cooling channels within the circuit package itself, which tends to necessarily move circuit elements further apart and to thereby increase signal transit times and increase structural size.

For example, both the CRAY2 and CRAY3 3-dimensional interconnected supercomputers use liquid immersion cooling. In the CRAY2, packaged IC devices are used to prevent contact of the fluorinert cooling fluid with the IC die. This leads to nearly an order of magnitude degradation in linear packing density in the horizontal plane and about a factor of 3 degradation in vertical stacking pitch, in comparison to the use of bare die. In the CRAY3, the fluorinert cooling fluid is in direct contact with the bare semiconductor IC die, a situation which gives much higher circuit density, but causes serious concerns for reliability because of the possibility of contamination, corrosion, etc. from the cooling fluid contact. Further, in order that the vertical interconnect structure not block the flow of coolant fluid, the use of an exotic, difficult to manufacture and rework, and very expensive vertical interconnect approach was required. As an alternative to liquid immersion cooling of 3-dimensional interconnected systems, large numbers of small cooling channels in the substrate or an intersperser board could be considered. However, the presence of these channels tends to block access for vertical interconnect paths, reducing connectivity of the system, and further, such an approach tends to be complex and expensive.

In the present invention, the extremely high thermal conductivity of diamond permits adequate heat removal from the defined three-dimensional circuit structure by heat exchange means that do not substantially interfere with electronic element density, with vertical interconnect density, or with the desire for small physical size.

Further features and advantages of the invention will become more readily apparent from the following detailed description when taken in conjunction with the accompanying drawings.

DESCRIPTION OF THE PREFERRED EMBODIMENTS

Figure 1:
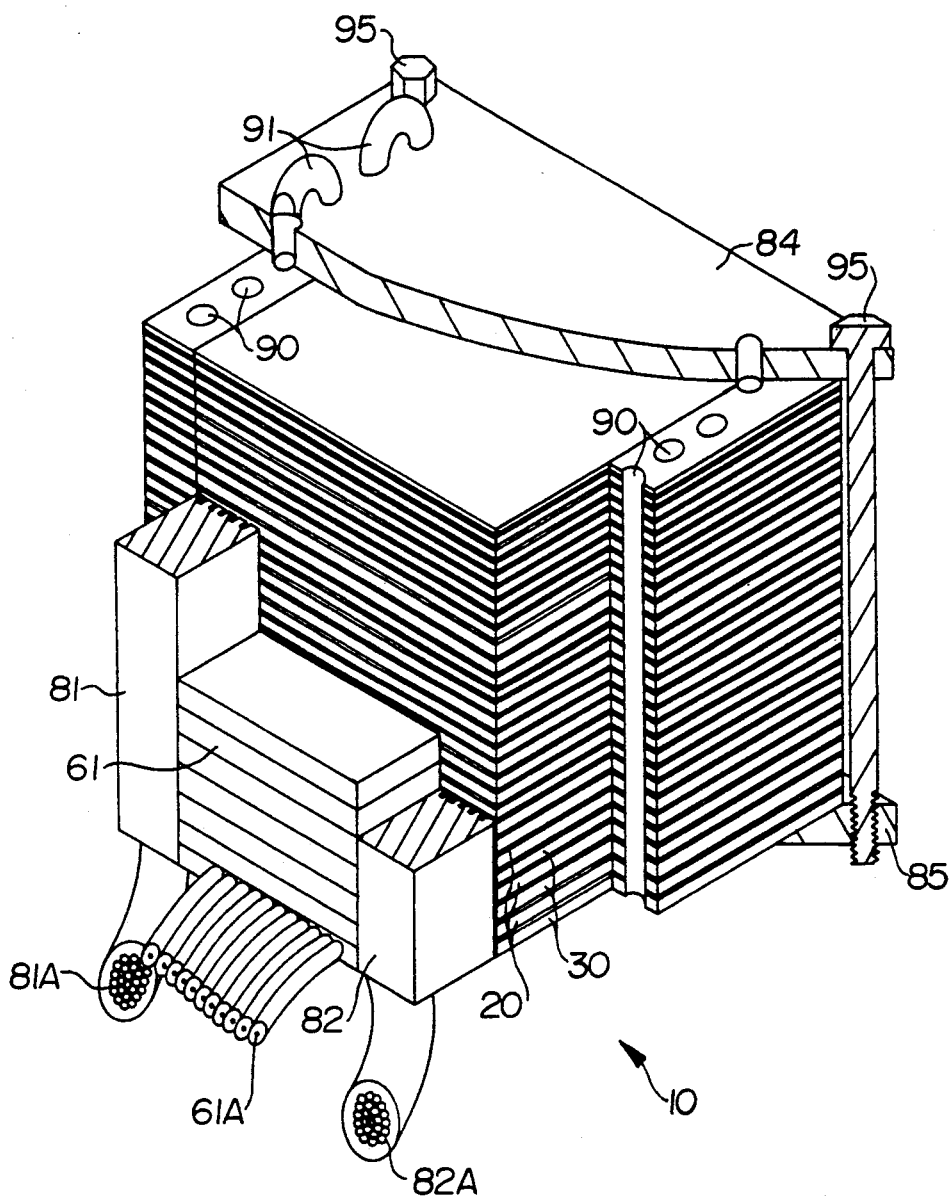
FIG. 1 is a diagram, partially broken away, of an external representation of an electronic circuit in accordance with an embodiment of the invention and which can be fabricated in accordance with an embodiment of the method of the invention.

Referring to FIG. 1, there is shown an external representation of an electronic circuit 10 in accordance with an embodiment of the invention and which can be fabricated in accordance with an embodiment of the method of the invention. The electronic circuit may be of any type, although the invention is particularly applicable to very high speed circuits wherein the distance between the components must be minimized and other circuits wherein there is a high density of components such as integrated circuit chips and thermal conditions must be controlled. The circuitry may comprise, for example, one or more processors or computers or a portion of a single large processor or computer, such as a supercomputer. The structure 10 is in the form of a layered cube in the present embodiment, although it will become understood that other shapes can be utilized. The cube includes a plurality of generally planar substrate layers 20, a multiplicity of such layers being used in the illustrated embodiment. The substrate layers comprise an electrically insulating material having a high thermal conductivity, synthetic diamond being most preferred. A plurality of spacer layers (alternatively called spacer boards) 30 are interleaved between the diamond layers 20, a multiplicity of such spacer boards being used in the illustrated embodiment. The spacer boards are also generally planar and are preferably formed of an insulating material, for example a plastic, and carry an array of vertical interconnect means for connecting between adjacent substrate layers. For a square rectangloid (rectangular parallelepiped) configuration, the substrate layers 20 and the spacer board 30 will both have approximately square shapes, and for a cube configuration the height of the structure will approximate its length and width dimensions. For initial understanding of the arrangement of layers 20 and 30, reference can be made to the cross-sectional illustration of FIG. 4 which shows an adjacent layer pair (20 and 30) separated, and FIG. 5 which shows six assembled layers. FIG. 1 also shows initial representation of heat exchanging apertures 90 which receive heat exchange fluid through liquid coolant manifold tubes 91, input power contact blocks 81 and 82 (with their associated cables 81A and 82A), and the top and bottom pressure plates 84 and 85, which may also carry arrays of input/output contacts. Mating and securing force is applied on the stack by bolts 95, two of which are visible in FIG. 1, which engage threaded receptacles in the bottom plate 85, or nuts on the bottom side of this plate.

Figure 2:
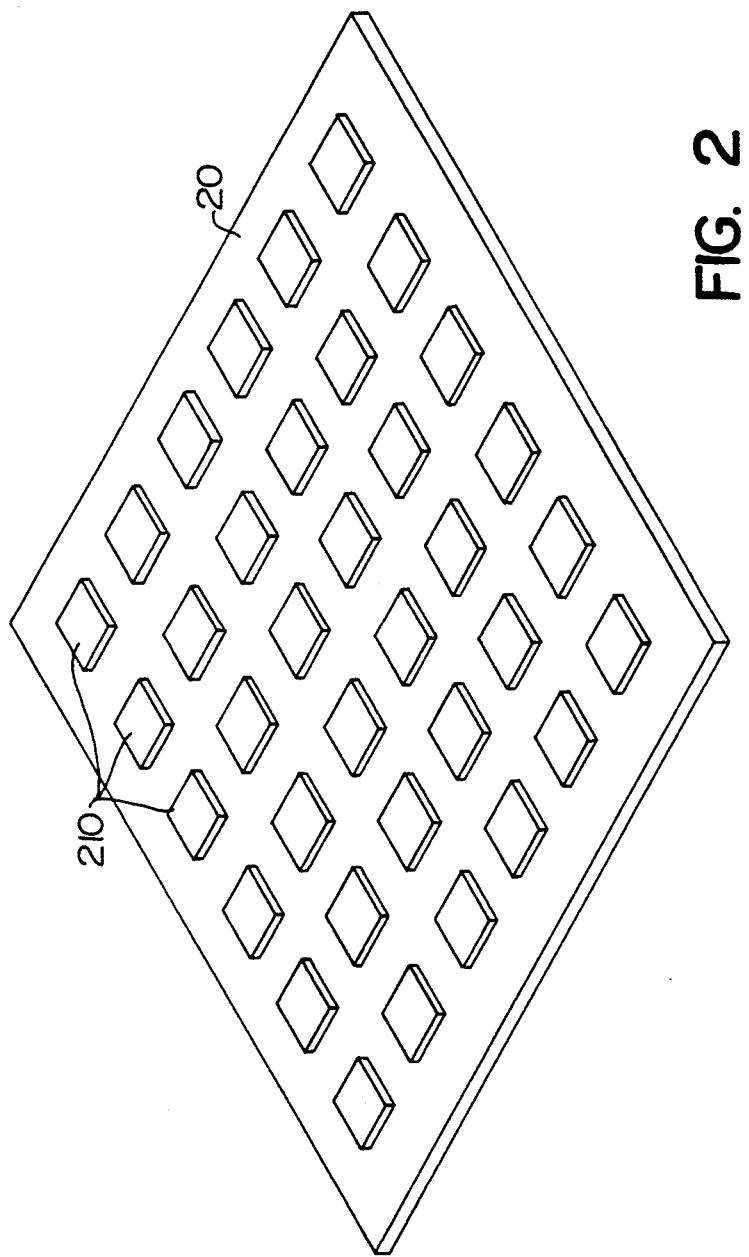
FIG. 2 illustrates an arrangement of chips on a diamond substrate layer used in an embodiment of the invention.

In the present embodiment, at least some of the diamond layers have mounted thereon a number of integrated circuit chips or dies 210, as can be initially seen in FIG. 2, which illustrates an arrangement of thirty-six chips 210 on a diamond substrate layer 20. The substrate layer is shown in this illustration without the opposing edges that contain the heat exchanging apertures 90. The chips are shown as being arranged in an array of columns and rows, and the chips can be mounted on the substrate (or on a metallization on the substrate, as seen in FIG. 8) by any suitable die bonding method. A thermally conductive epoxy will provide relief of strain due to thermal expansion mismatch between the diamond substrate and a gallium arsenide or silicon die. A diamond-filled thermally conductive epoxy could also be used where electrical insulation and very high thermal conductivity are required. The chips 210 are shown as having a generally square shape, although it will be understood that the shape, size, number, and type of the components mounted on the substrate 20 may vary, consistent with the principles of the invention. The substrate 20 (see also FIGS. 4, 5, 7 and 8) contains patterns of conductors which are coupled with circuitry on the chips.

Figure 6:
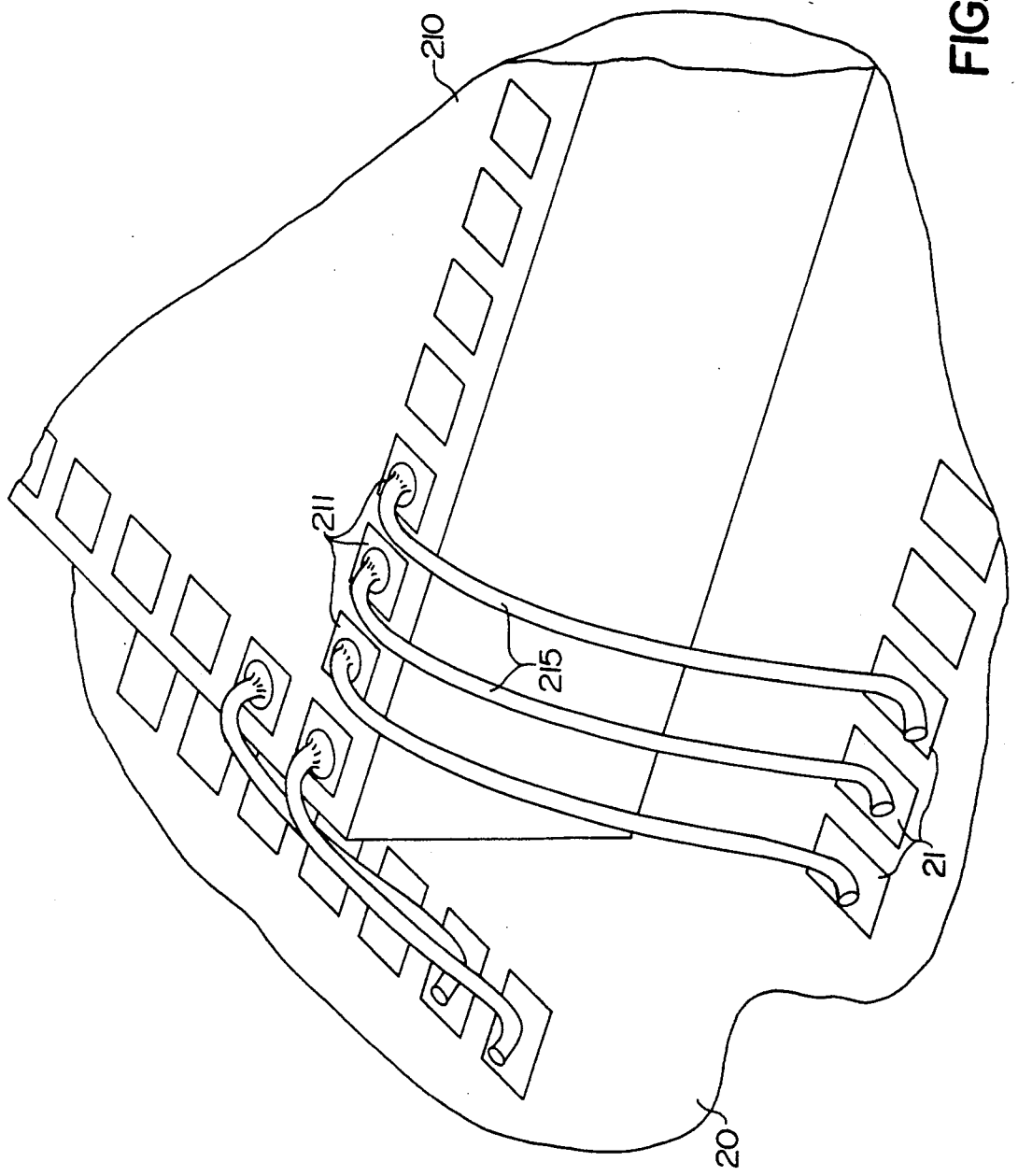
FIG. 6 illustrates an example of bonding of conductor pads on a chip to conductor pads on a substrate.

FIG. 6 illustrates an example of a technique which can be utilized to connect metal contact pads 211 on a chip 210 to contacts (or pads) 21 on the surface of substrate 20. The contact pads, like other conductive patterns on the substrate, can be applied and patterned using conventional metal deposition and lithographic techniques. A conventional lead bonding machine can be utilized to connect individual leads 215 as seen in FIG. 6, or tapes of leads, in the technique known as tape automated bonding ("TAB"), can be used to implement coupling between circuitry of the die and contacts on the substrate. The contacts on the substrate are coupled with conductors in the substrate, as will be described further in conjunction with FIGS. 7 and 8. A number of further techniques for lead bonding are well known in the art, and can be utilized herein. For example, a form of bonding which includes both die bonding and lead bonding functions is "flip-chip" bonding. In this approach, an array of contact pads spread over the face of the integrated circuit die is soldered to a matching array of pads on the substrate, so that the die is attached face-down, or flipped over relative to the usual attachment configuration.

Figure 3A:
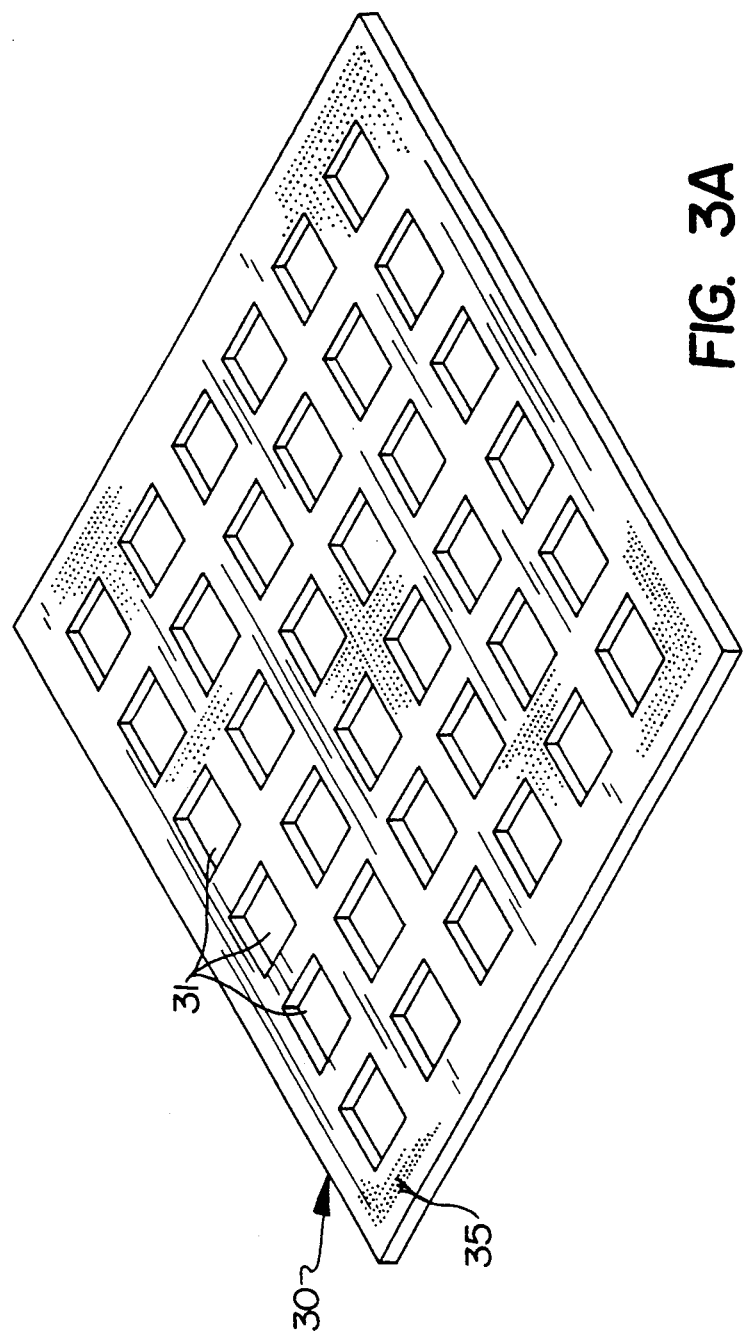
FIG. 3A is a diagram of a spacer board utilized in an embodiment of the invention.
Figure 3B:
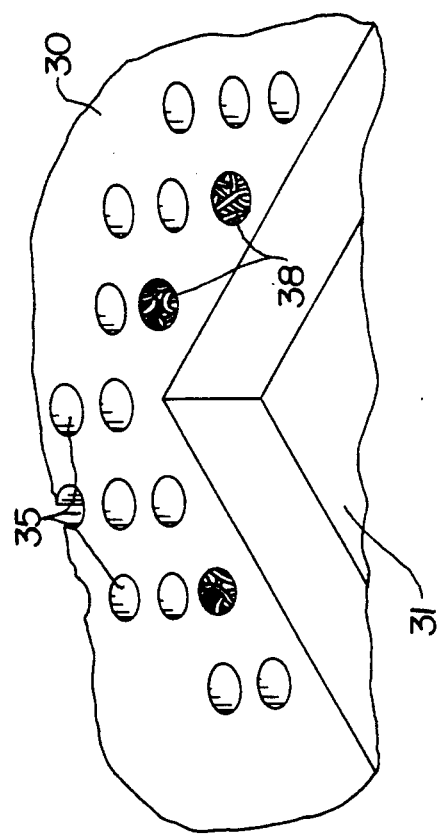
FIG. 3B shows an enlargement of a small portion of the spacer board.

Referring to FIG. 3A, there is shown an embodiment of a spacer or separator board 30, which may be formed, for example, of a high accuracy plastic material, for example a polyetherimide such as Ultem, sold by General Electric Corp. The board 30 has an array of larger apertures 31 (thirty-six of them in this example) which match the shape of the array of chips 210 on the underlying substrate 20, so that the spacer board will receive the protruding chips 210, with clearance for lead bonds, and lie substantially flush on the surface of the substrate 20 below. As seen in FIG. 3B, the spacer board 30 also includes a multiplicity of smaller circular holes 35 (made by molding or other means, e.g. by mechanical drilling or laser drilling), selected ones of which (including all of which, if desired) can receive conductors 38 that will serve as vertical interconnects between conductors or contacts on the top surface of the substrate 20 positioned beneath the board 30 and the bottom surface of the substrate 20 positioned above the board. In the illustrated embodiment hereof, the conductors 38 are so-called "fuzz buttons" which are wadded cylinders of conductive metal fibers that facilitate electrical connection to matching arrays of contact pads on the substrates above and below the fuzz buttons (see also FIGS. 4, 5 and 8). The use of such boards and of fuzz buttons is known in the art and is described, for example, in R. Smolley, "Button Board, A New Technology Interconnect For 2 and 3 Dimensional Packaging", International Society For Hybrid Microelectronics, Anaheim, Calif. (November 1985); and R. Smolley, "Connectorless High Speed Interconnect", Government Microcircuit Applications Conference, Orlando, Fla. (October 1987). The fuzz buttons can be inserted into the spacer board (button board) either manually on an assembly line, or by an automatic insertion machine. Button boards, fuzz buttons, and insertion equipment are marketed, for example, by Cinch Connector Division of Labinal Components And Systems, Inc., Elk Grove Village, Ill. It will be understood that other types of vertical interconnect conductor array approaches can be utilized for the spacer boards 30.

Figure 4:
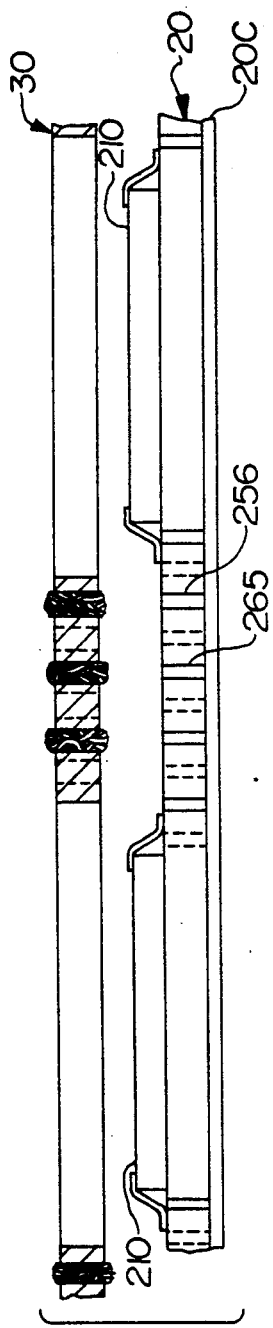
FIG. 4 illustrates a substrate layer with representative chips and conductors aligned with a spacer board with its representative conductors before mating of the substrate layer and the spacer board.
Figure 5:
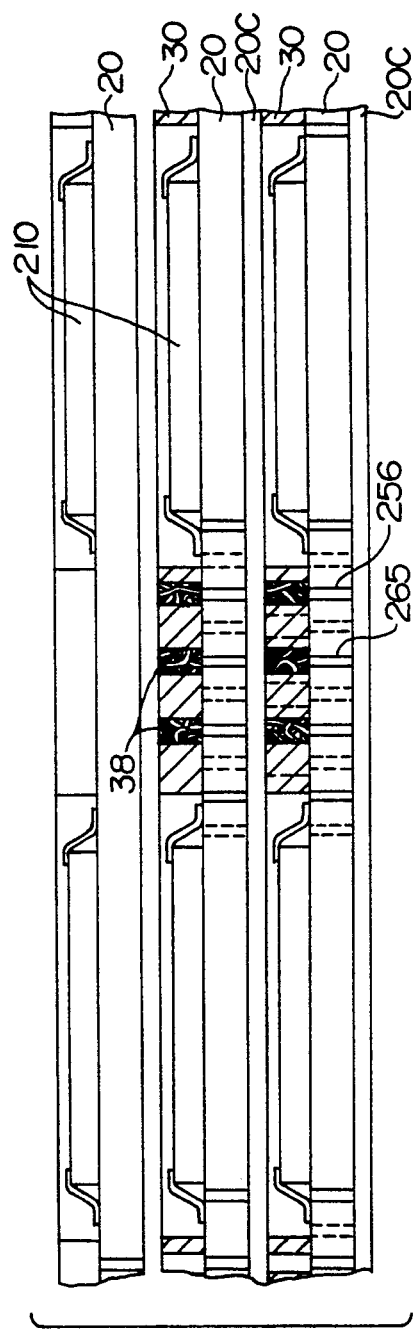
FIG. 5 is a cross-sectional representation of a number of substrate layers and spacer boards after mating thereof.
Figure 7:
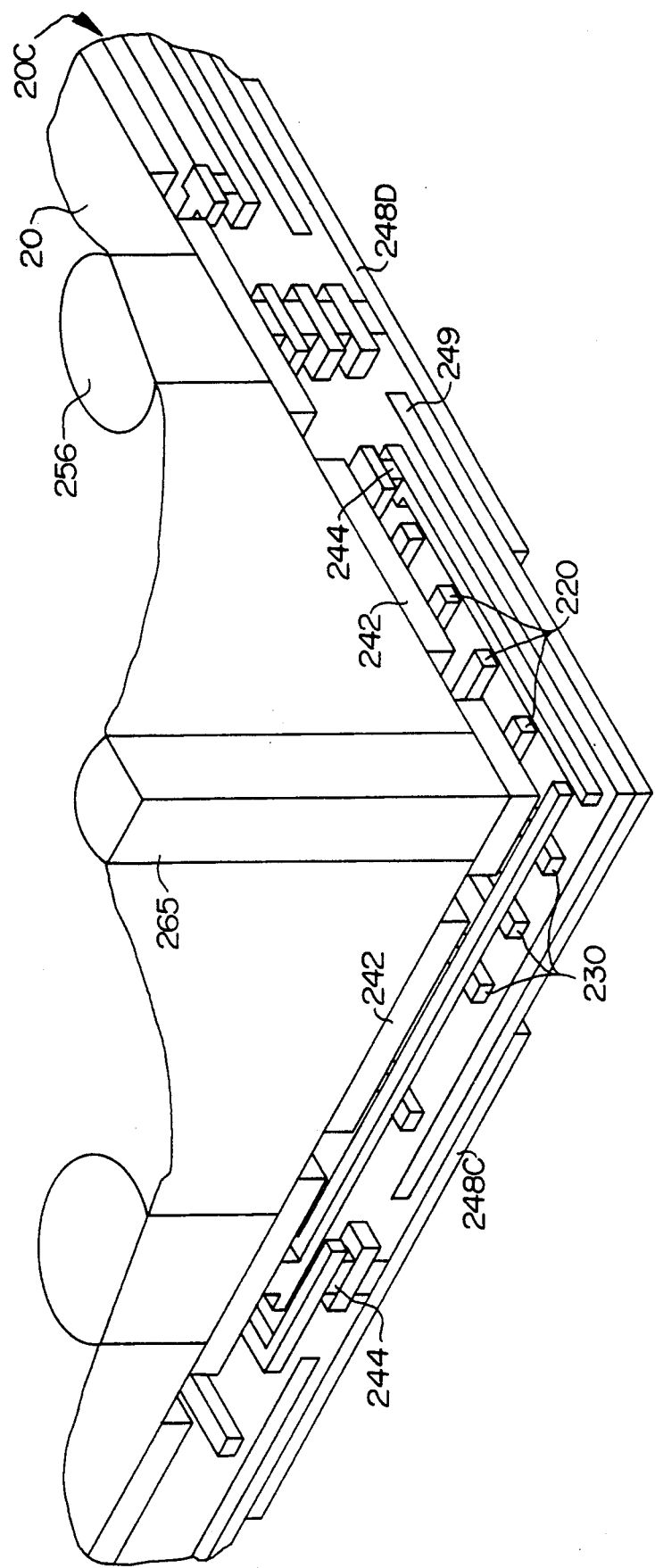
FIG. 7 is a cross-sectional and exploded perspective view of a conductor pattern on a substrate as used in an illustrated embodiment.
Figure 8:
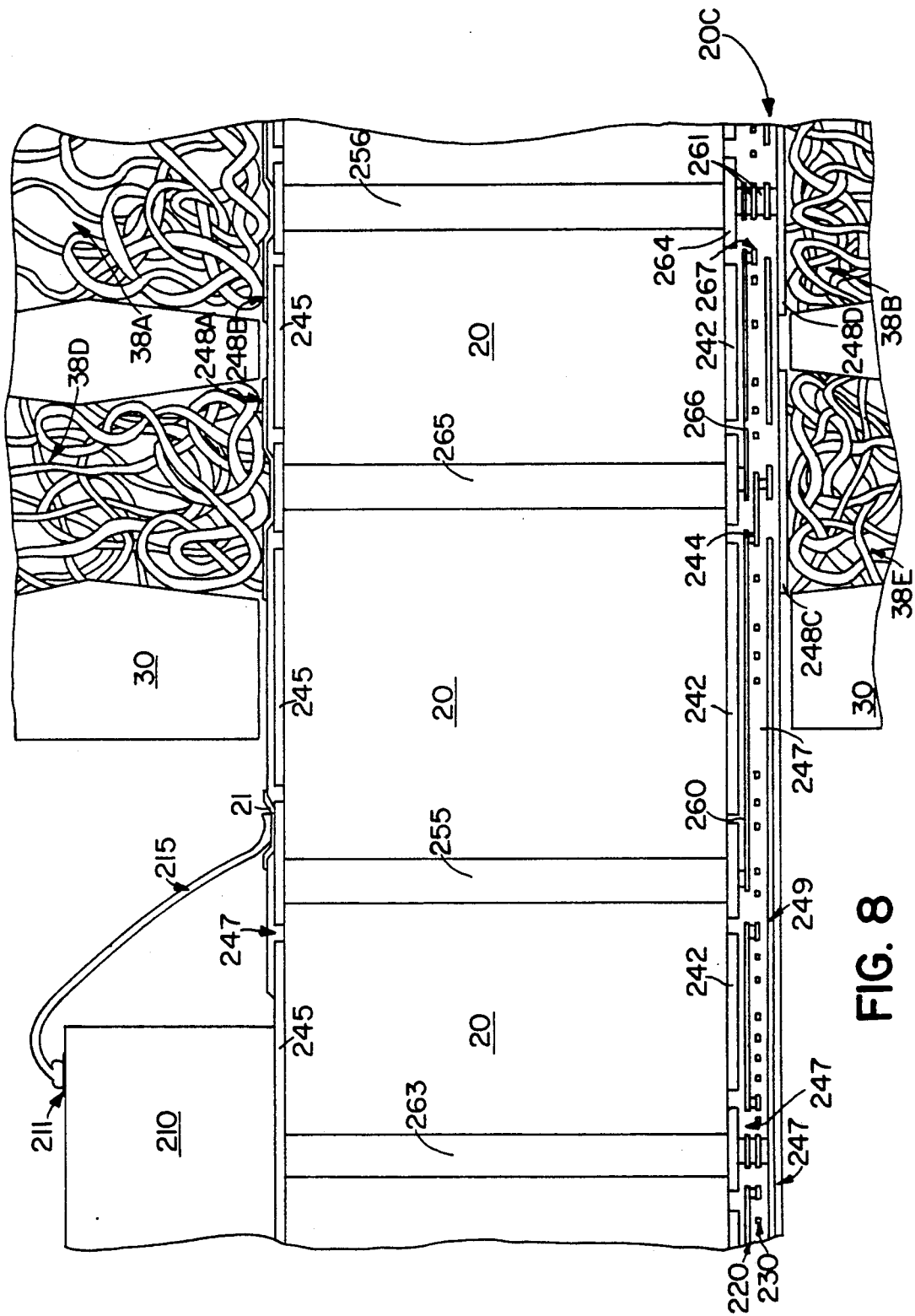
FIG. 8 is a cross-sectional view of a spacer board and substrate showing examples of conductor couplings.

In the illustrated embodiment hereof, multiple layer patterns of conductors are applied to the bottoms of each of the diamond substrate layers 20, as represented generally at 20C on some of the substrates of FIGS. 4 and 5, and as seen in further detail in FIGS. 7 and 8. FIG. 7 shows a cross-sectional perspective and broken-away view of an embodiment of the bottom side of a substrate 20 and of the types of conductive patterns that can be utilized in conjunction with the substrate. In the example of FIG. 7, a layer of spaced conductors 220 runs in one direction and, in a plane spaced vertically therefrom, another layer of conductors 230 runs in a direction perpendicular to the direction of conductors 220. It will be understood that further layers of individual conductors can be provided, if desired,. or other conductor arrangements can be utilized. Vertical connections between the various layers of conductors can be implemented using conductive vias, as illustrated at 244. These conductors may also make contact with an array of conductive via posts (e.g. 256, 265, etc.) through the substrate 20 which allow for contact to metallization patterns, device contact pads or vertical interconnect pads on the top surface of the substrate 20. Top and bottom layers of metal contact pads are represented, for example, at 21, 248A, 248B, 248C and 248D, only the two bottom pads 248C and 248D being visible in FIG. 7. Upper and lower conductive planes 245 and 242 are applied as metallizations (with suitable openings for contacts as seen in FIG. 8), and respectively carry electrical potential to power the devices in the chips 210. In this example, the bottom metallization 242 will be coupled to a bias voltage $V_{DD}$, and metallization 245, on the top surface of the substrate, will be coupled to ground reference potential. The layers of conductors and individual conductors, as the case may be, have suitable insulating material therebetween, for example "BCB" (benzocyclobutene), indicated generally at 247. Techniques for applying and etching the metal layers using photolithographic techniques are well known in the art and are not, of themselves, inventive features hereof. Reference can be made, for example, to Tummala et al., "Microelectronics Packaging Handbook", Van Nostrand Reinhold (1989)

Referring to FIG. 8, there is shown a cross-sectional view of a small portion of a representative diamond substrate layer 20, the lead and contact structure mounted thereon, the adjacent spacer boards 30, and representative fuzz buttons in the spacer boards coupled to contact pads on the top and bottom surfaces of the substrate 20. In particular, there is shown the diamond substrate 20, and a representative ones of a pattern of layered conductors (e.g. 242, 220, 230, and 249), as first described in conjunction with FIG. 7. In the example of FIG. 8, it is seen that a metallization plane 245 (at ground reference potential) is deposited on the available regions of the substrate 20, including the regions where the chips 210 are to be bonded to the substrate. A portion of a chip 210 is shown in FIG. 8, together with the pad contacts 211 and 21 and the wire or TAB metal interconnect 215 that were first described in conjunction with FIG. 6. In the example of FIG. 8, conductive vias 255, 256, 263 and 265 are illustrated as providing connection between contact pads on the top and bottom of the substrate 20. [Representative corresponding vias are also shown in FIG. 7.] In particular, the via 255 couples contact pad 21 to a conductor 260 of the conductor row 220. From there, coupling is effected by a via (244), and further conductors, to the pad 248C, which couples in this example to a fuzz button 38E in the underlying spacer board 30. Another, larger pad 248B on the surface of substrate 20 is connected by via 256 and the stack of inter-layer vias 261 to a contact 248D on the bottom of the substrate. The contact 248B on the top of substrate 20 is coupled, in this example, to a fuzz button 38A in the overlying spacer board 30, and the contact 248D is coupled to a fuzz button 38B in the underlying spacer board. Representative fuzz button 38D in the overlying spacer board is also shown, and is coupled with contact pad 248A which couples to the conductors 266 and 267. Another via example, 263, is shown under the chip 210 which connects the ground plane 245 on top of substrate 20 to another ground plane 249 on the bottom of the multi-layer interconnects.

Figure 9:
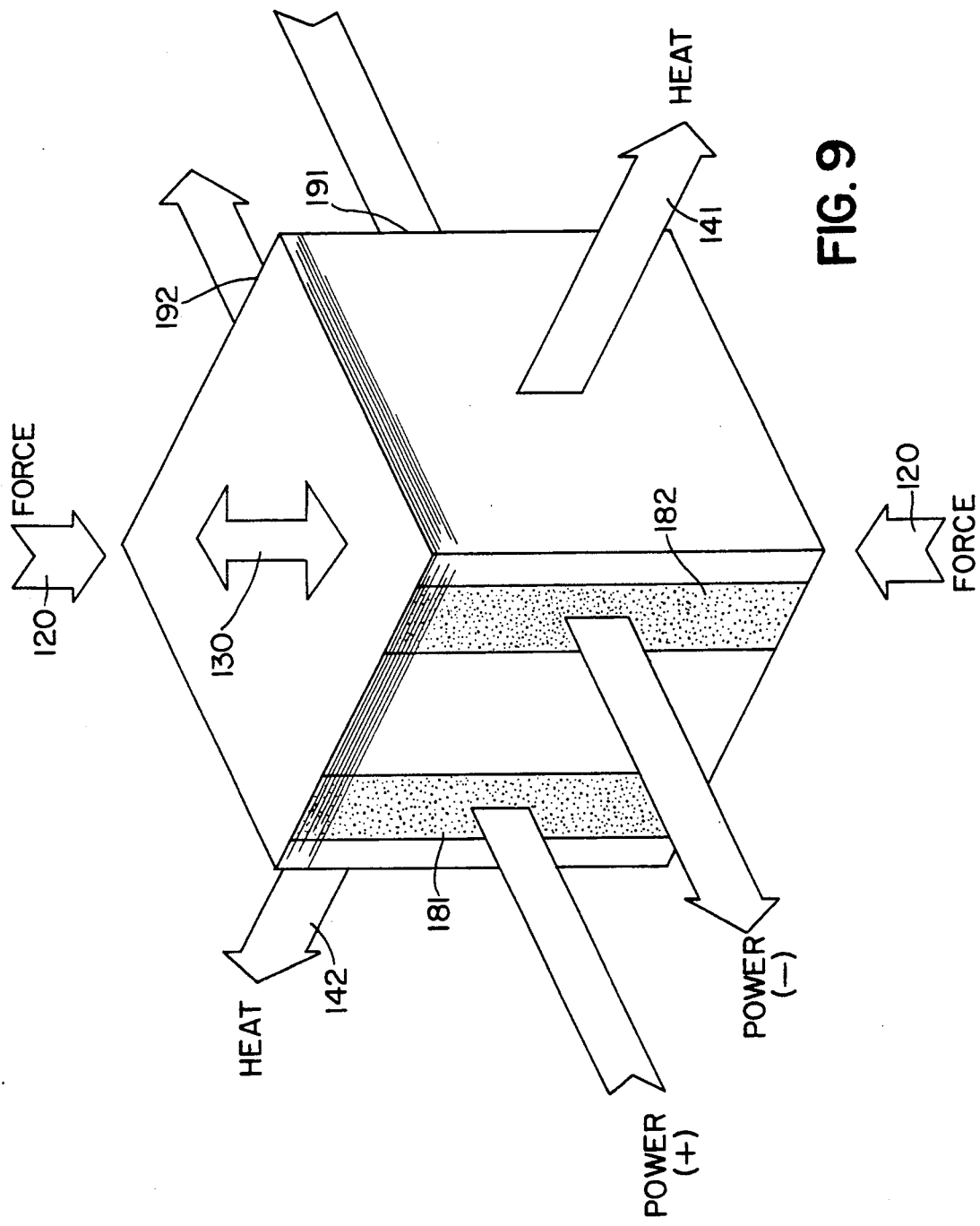
FIG. 9 illustrates generally the plan of the present embodiment for power coupling, input/output signal interconnects, assembly force, and heat removal.

FIG. 9 illustrates generally the plan of the present embodiment for power coupling, input/output signal interconnects, assembly force, and heat removal from the circuit 10. As seen initially in FIG. 9, a bias potential $V_{DD}$ and ground reference potential are respectively applied to vertical power contact strips 181 and 182 along one side of the circuit cube 10, and to vertical power strips 181 and 182 (not visible) along the opposing sides of the cube 10. The input power contact blocks 81 and 82 (see FIG. 1) are used for this purpose. Input and output interconnects, in the present embodiment, may be applied to the top and bottom of the cube 10 (as well as the sides between the power contact blocks), as is the force utilized for mating and retaining the layers and the button board contacts previously described. These functions are represented by arrows 120 and 130 in FIG. 9, and reference can also be made to contact board 85 and the cap and bolt 95 of FIG. 1. The two remaining surfaces of the cube, are used to remove heat from the cube with heat exchange fluid, these functions being represented by arrows 141 and 142 in FIG. 9. Reference can also be made to heat exchanging apertures 90 and heat exchange fluid as first mentioned in conjunction with FIG. 1.

Figure 10:
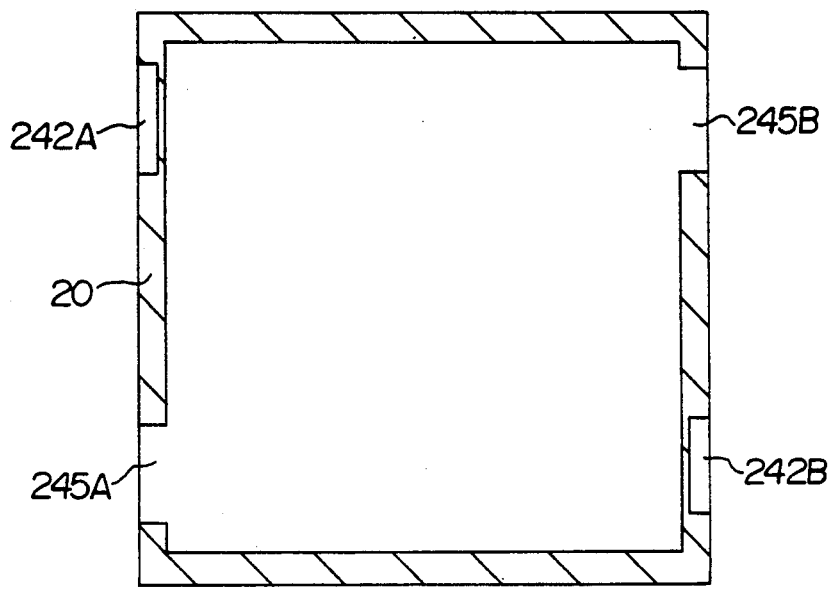
FIG. 10 illustrates the top original metallization for the ground plane on the substrate in an embodiment of the invention.
Figure 11:
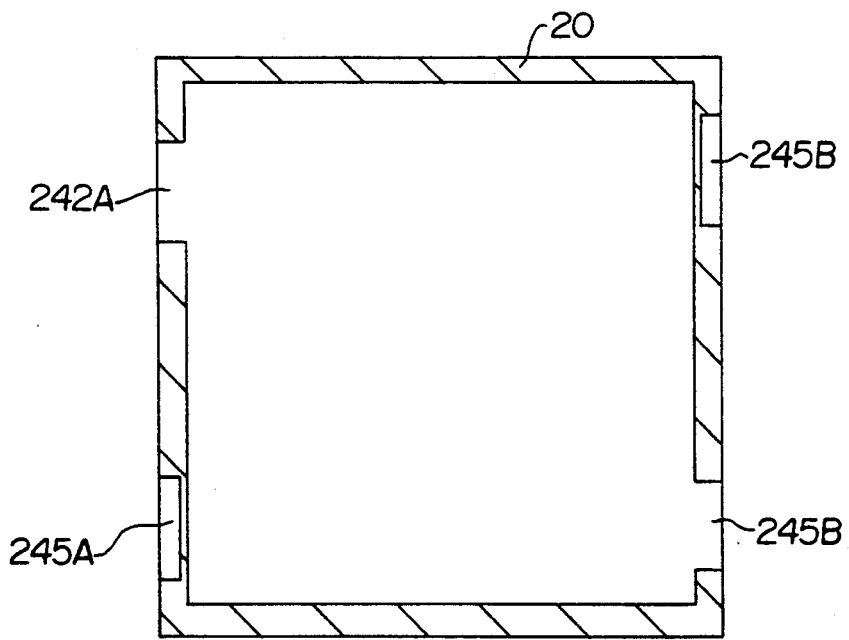
FIG. 11 illustrates the bottom original metallization for the bias plane on the substrate in an embodiment of the invention.
Figure 12:
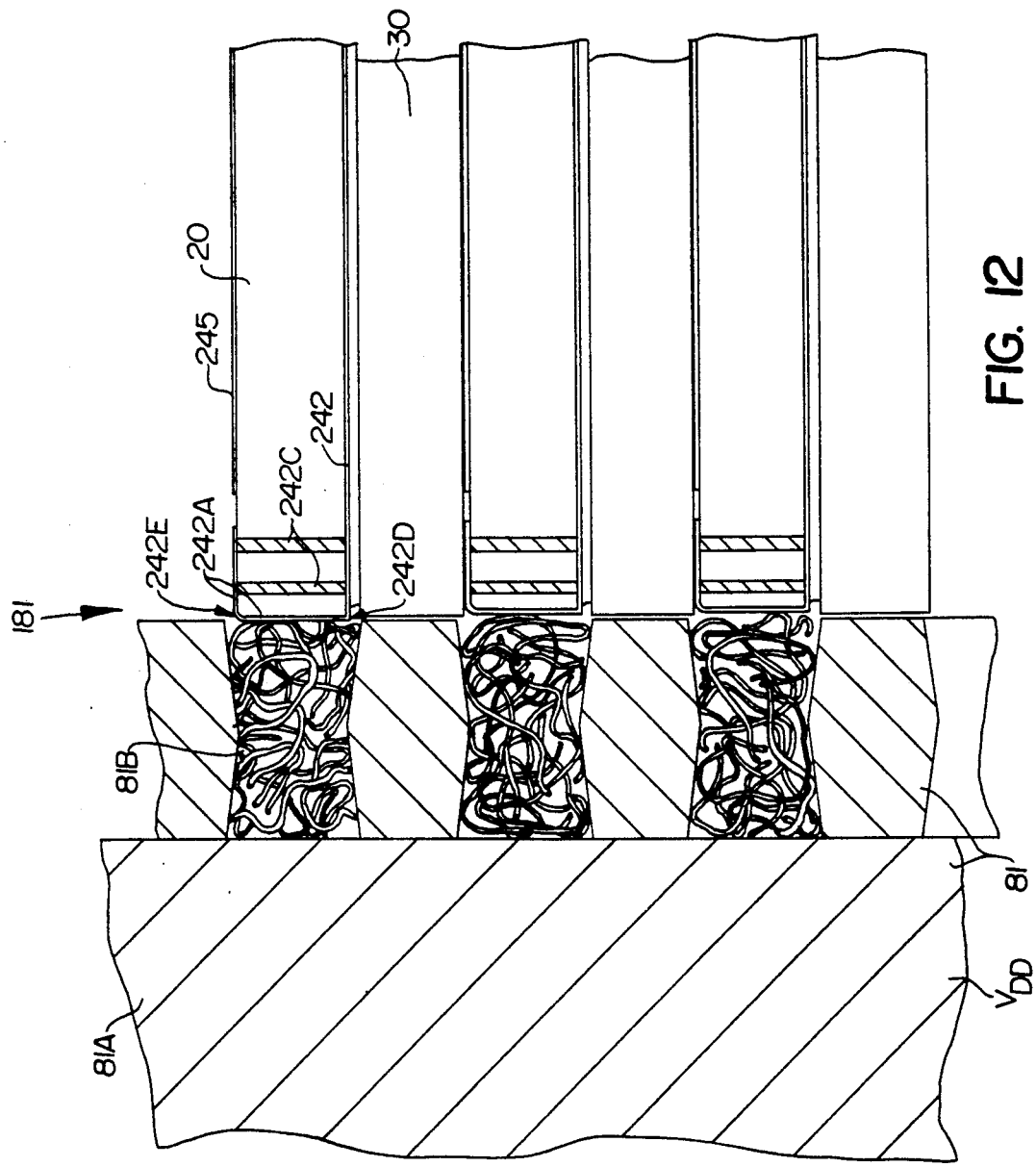
FIG. 12 is a cross-sectional view of edges of substrates including metallization tabs for power contact.
Figure 13:
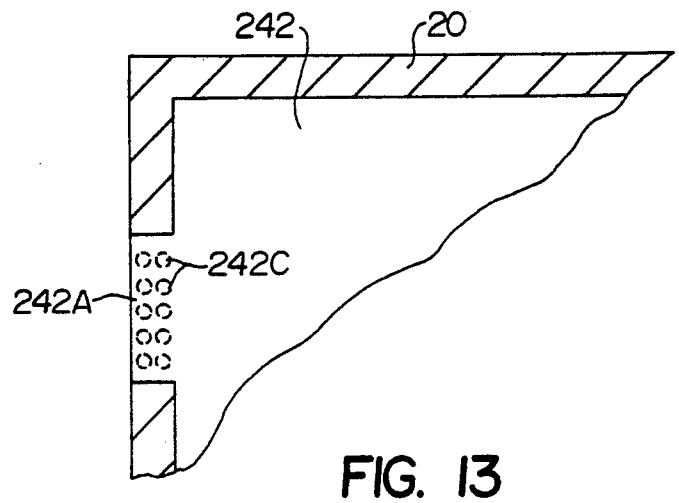
FIG. 13 illustrates the conductive vias utilized in conjunction with the tab wrap arounds for power contacts.

FIGS. 10 and 11 illustrate the respective top and bottom original metallizations for the ground plane (reference numeral 245—see also FIG. 8) and the $V_{DD}$ plane (reference numeral 242—see also FIGS. 7 and 8) on a substrate layer 20. In both cases, the original metallizations are shown, it being understood that portions of the metal will be removed for placement of contacts and conductor and insulating regions around the contacts and conductors, as represented, for example, in FIGS. 7 and 8. As seen in FIGS. 10 and 11, both metallizations have dimensions slightly smaller than the substrate layer 20, so that there are borders of substrate material outside the metallizations, except at the positions of tabs 245A and 245B for ground plane 245, and tabs 242A and 242B for $V_{DD}$ plane 242. Each of the tabs continues around the side edge of the diamond substrate, and terminates on the opposing side of the substrate 20. Thus, the ends of tabs 245A and 245 of FIG. 10 are seen in FIG. 11, and the ends of tabs 242A and 242B of FIG. 11 are seen in FIG. 10. The edge portions of the corresponding tabs of different substrate layers constitute the strips 181, 182, 191 and 192 of FIG. 9. FIG. 12 shows a cross-sectional representation of the strip 181 on a number of representative diamond substrates 20 on opposite sides of a representative spacer board 30. The $V_{DD}$ metallizations 242 are seen to have tabs 242A that wrap around the edges of their respective substrate layers, and the ground metallizations 245 are seen (for the view of this diagram) to be deposited on the respective top surfaces of the substrates. Conductive vias 242C are shown (and are also shown in dashed line in FIG. 13), these conductors being utilized in conjunction with the wrap-arounds to ensure good contact to the metallization in case an edge corner at 242D or 242E (FIG. 12) is poorly formed or wears away. FIG. 12 also illustrates how contact can be made to the strips such as 181, the Figure illustrating the contact block 81 which, in this example, carries $V_{DD}$ from a metal power bar 81A to the tabs 242A which constitute the strip 181 using fuzz buttons 81B mounted in holes in the board 81. It will be understood that alternative means can be utilized to apply power to the strips or to other circuit arrangements.

Figure 15:
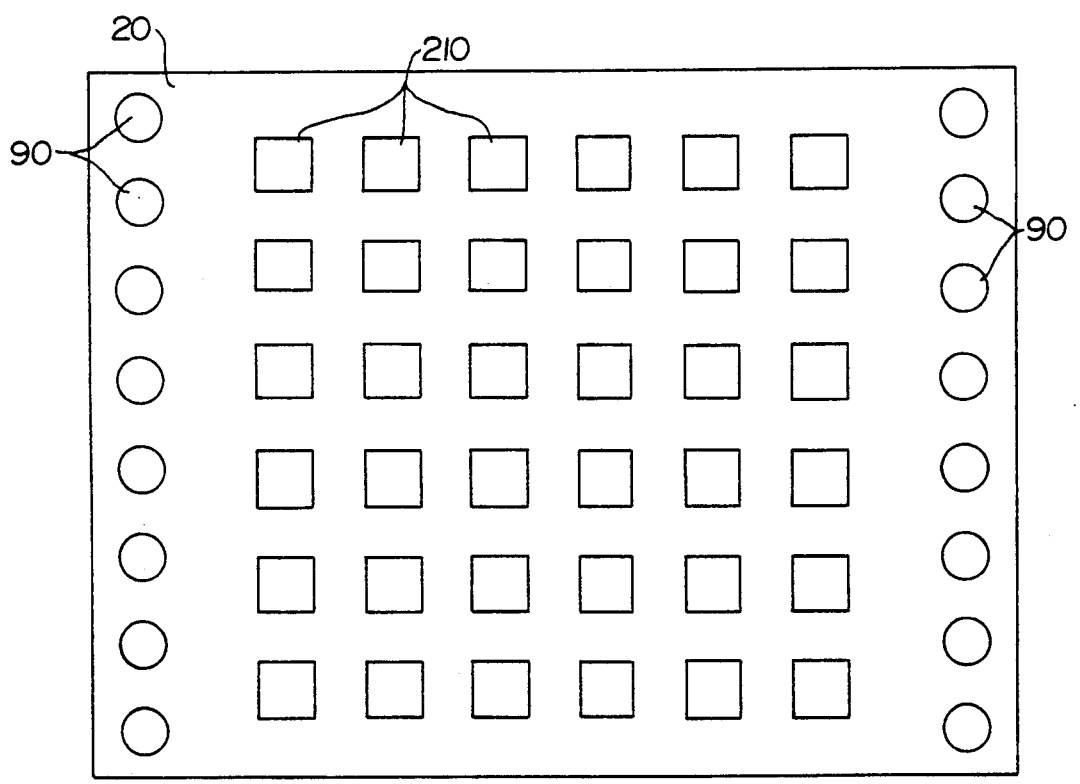
FIG. 15 shows a plan view of a diamond substrate layer, with heat exchanging apertures.
Figure 14:
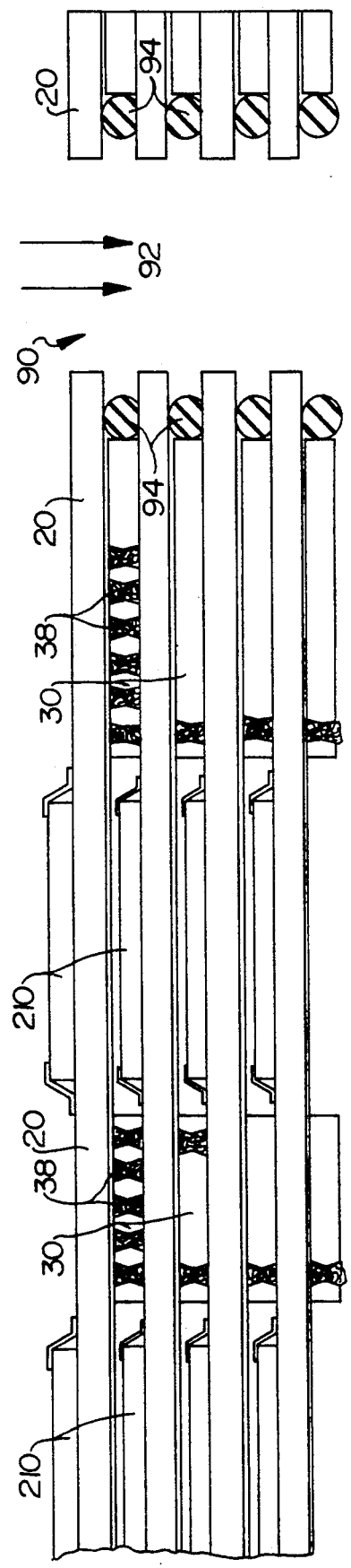
FIG. 14 illustrates the heat exchange process utilized in an embodiment of the invention.

FIGS. 14 illustrates the manner in which a heat exchange fluid, such as water, can be circulated through the heat exchange apertures 90 first shown in FIG. 1. The Figure shows a number of diamond substrate layers 20 with chips 210 and the intervening spacer boards 30. Cooling fluid will flow vertically through the channel (arrows 92) formed by the apertures 90 (see also FIG. 1 and then substrate plan view of FIG. 15) and the O-rings or grommets 94 which are provided for sealing the channel. It will be understood that the substrate need not be as uniform in thickness, or have as high a degree of surface finish in the cooling region as required in the active electronics area. For example, the substrate could taper down somewhat in thickness in this region if materials availability considerations make this desirable. Further cooling could be provided on the adjacent edges of the cube, for example between the strips utilized for power contacts, though the limited additional cooling made available by this would probably not be worth the sacrifice of the capability to do edge signal contacts directly to boards using these areas, as illustrated in FIG. 1 by representative contact boards 61 and cables 61A. Use of this area for cooling would also make it difficult to use dummy substrate boards as a method for providing large numbers of interconnects to the circuit module.

The active electronics area of the diamond substrate (e.g. FIGS. 2 or 15) may typically be of the order of 100 mm (4 inches) square. This precludes the use of natural diamond for this application. Synthetic diamond can be grown in the required range of size and thickness by the method of chemical vapor deposition (CVD), such as the use of a hydrogen dc arc torch with a small percentage (e.g. 1 percent) methane carbon source. Diamond CVD growth technology is known in the art and is reviewed, for example, in the article by R. C. DeVries in the Annual Reviews of Materials Science), Vol. 17, pg. 161 (1987). As with any emerging materials technology, improved diamond CVD growth techniques are likely to emerge in the future, but the current technology is capable of growing synthetic diamond material in the required range of area and thickness for the present application. Reference can also be made to Proceedings of the "First International Symposium on Diamond and Diamond-Like Films", The Electrochemical Society, Pennington, N.J., Proceedings Vol. 89-12 (1989); B. V. Spitzyn, L. L. Boulov, and B. V. Derjaguin, Progress in Crystal Growth and Characterization 17, pg. 79 (1988); P. D. Gigl, New Synthesis Techniques, Properties, And Applications For Industrial Diamond, IDA Ultrahard Materials Seminar, Toronto, Canada (September 1989) as well as to equipments and techniques disclosed in U.S. Pat. Nos. 4,471,003, 4,487,169, 4,691,662, 4,630,566, 4,585,668 and 4,507,588.

In applications where all of the chips 210 in FIG. 2 have essentially the same power dissipation, the thermal conditions on the substrate may be reasonably approximated as that of a uniform power density P/A applied over the area of the substrate. For such a uniform power density case, assuming only thermal conduction, if the substrate thickness is z and its thermal conductivity is k, and the distance between the heat sink planes is L, then the maximum temperature rise in the substrate above the heat sink temperature, $T_o$, will be given by $$T_M - T_o = (P/A)L^2/8 \ kz \qquad (1)$$

where $T_M$ is the maximum temperature on the substrate (on a plane half way between the heat sinks). If the substrate is square (both sides=L), then the area $A = L^2$ and from equation (1) one can obtain the thermal resistance as $$R_{th} = (T_M - T_o)/P = \frac{1}{8} \ kz \qquad (2)$$

where the power P is the total power uniformly distributed on the square substrate.

As an example of the use of equation (2), the highest reported room temperature thermal conductivity to date for synthetic diamond is about k=1600 W/m degree K. From equation (2), the thermal resistance of a square substrate with heat sinks on two opposing sides having a thickness of z=1 mm will be about $R_{th}$=0.078 degrees K./watt. For the example of FIG. 2, with 36 chips on the substrate each dissipating 10 watts, or a total power of P=360 watts, the temperature rise will be only $T_M$—To=28 degrees K. above the heat sink temperature. Hence, a substrate thickness of about 1 mm can be utilized even at high power levels, with selection of thickness (above a minimum needed for structural integrity during fabrication) being determined by factors such as the actual thermal conductivity, substrate dimensions, cost, device power density, and the desired maximum temperature rise. In a design example hereof, the substrate areas shown in FIG. 2 are about 4 inches square, with 0.6 inch additional on two opposing ends for the holes 90 that receive the heat exchange fluid. The original substrates can by slightly larger and laser cut to the desired dimensions. Mechanical finishing after laser cutting can be used to support quality edge metallization. The as-grown synthetic diamond substrate layers, using present technology, will generally have one relatively smooth side and one relatively rough side (due to diamond crystal growth facets), and significant thickness variations. Two types of approaches can be utilized to achieve the desired surface flatness and finish: removal or lamination. A removal approach to achieving, for example, a 1 mm thick diamond substrate would involve growing to a 1 mm minimum thickness over the active electronics area and then either grinding or lapping down to a uniform 1 mm thickness (which will be time consuming, but which would be improved by double-sided lapping), or by applying laser removal or chemical/mechanical polishing technique for this purpose. In an alternate approach, a thinner substrate is grown and then the rough side is laminated up to the desired thickness with another material such as a ceramic. This would compromise the average thermal conductivity somewhat, but if the original diamond layer is of reasonably uniform thickness, this would not be a serious problem. This method is particularly attractive, for example, when the cooling requirements are such that 0.5 mm or less of diamond would suffice.

Regarding the obtainment of the via holes, it is desirable to have reasonably high aspect ratio via holes in order to support large numbers of IC pins and their connection to the high density multilayer interconnects on the other side of the substrate. A diameter of 2 mils to 4 mils (0.05 mm to 0.1 mm) would be desirable though larger sizes may be acceptable. Mechanical drilling is limited by the hardness of the diamond, so laser drilling of the via holes will be preferred. If laminated substrates are used, the laminate materials must be compatible with the laser drilling process. It should be noted that laser drilling, as well as laser cutting, operations involve high temperatures which can cause local graphitization of the diamond, with consequent loss of its insulating character. This may necessitate edge treatment processes after some laser cutting operations on the diamond, and care in the laser drilling process to insure that the conductive regions do not extend too far from the laser drilled via holes. Otherwise, unacceptable conduction between vias or from vias to other metallization could result.

Regarding the metal-filling of via holes, plating or conventional metal paste type filling can be utilized, but with caution to keep temperatures below the diamond graphitization temperature. Conductive epoxy could also be used, but may give less reliable, higher resistance contacts to the metallization layers on the top and bottom surfaces of the substrate.

Regarding application of the metal layers, conductors, and contacts, adherent, reasonably thick (e.g. 1 or 2 mils for high power applications) metallization is desirable on the top and bottom of the substrate, and on the edges used for power contacts. A suitable technique for metallization on diamond may be, for example, RF sputtering of titanium/platinum/gold thin film for good adherence, followed by selective plating of copper to achieve the desired thickness. The top, bottom and side first-level metallizations are patterned with proper alignment to the filled vias. As described, the principal multi-layer interconnect system is on the bottom of the diamond substrates, so as not to interfere with the thermal resistance of the IC die mounted on the top, or have the interconnect density compromised by the need for metal "thermal via" columns under the die or tab bonding sites. On the top, however, it is preferred to have a second metallization level for the pads (which make contact to the "fuzz buttons"), to avoid serious compromise between the pad sizes (and consequent circuit board to "fuzz button" spacer board alignment tolerances) and the first layer metallization area available for power handling (to minimize IR drop and metal migration concerns). A copper/BCB or copper/polyimide high density multi-layer interconnect approach, or other multi-layer interconnect approaches compatible with diamond, can be utilized.

In current "fuzz button" technology, the required mating force per button can be as low as 2 to 3 ounces for "flush" contact (as illustrated in FIGS. 8 or 12) for medium-light density buttons, or up to 5 ounces for heavier button densities (assuming a standard 20 mil diameter fuzz button). A four inch square button board like that illustrated in FIG. 3A might carry up to 5000 to 10,000 button contacts. Assuming 5000 fuzz button contacts to be mated at a 3 ounce per contact force, the total mating force to be applied through the top and bottom pressure plates would be about 940 pounds (nearly 60 pounds per square inch). The worst case (10,000 button at 5 ounces/button) would require 1.5 tons force or 195 psi. Such forces can be applied from four corner bolts as shown in FIG. 1, or other suitable configuration. Assembly alignment jigging is desirable for obtaining precise (e.g. a few mil accuracy) vertical alignment of the various substrate and spacer boards. While holes for alignment pins are sometimes used for this purpose, corner indexing is also possible and may save area.

The invention has been described with reference to particular preferred embodiments, but variations within the spirit and scope of the invention will occur to those skilled in the art. For example, while the superior thermal conductivity of diamond renders it the preferred material for the described structures hereof, it will be understood that some of the features of the invention are applicable for use with other thermally conductive substrate materials, particularly in circuits where thermal management requirements are less stringent. Also, it will be understood that various alternative heat exchanger configurations can be employed.

I claim:

1. A circuit comprising:
    a plurality of generally planar diamond substrate layers;
    electronic circuit elements mounted on each of said diamond substrate layers;
    said diamond substrate layers being disposed in a stack;
    electrically conductive horizontal interconnect means for coupling between circuit elements on individual substrate layers, and electrically conductive vertical interconnect means coupled through said substrate layers for coupling between circuit elements on different substrate layers; and
    apertures generally along the peripheries of said substrate layers for receiving heat exchange liquid; and
    heat exchange liquid passing through said apertures.

2. The circuit as defined by claim 1, further comprising at least one electrically insulating spacer boards disposed between adjacent substrate layers of the stack.

3. The circuit as defined by claim 1, wherein said electronic circuit elements mounted on each of said substrate layers comprises a multiplicity of circuit elements.

4. The circuit as defined by claim 1, wherein said plurality of circuit elements comprises a multiplicity of integrated circuit chips.

5. The circuit as defined by claim 1, wherein said plurality of diamond substrate layers comprises several diamond substrate layers, and wherein said vertical interconnect means comprise conductive vias which pass through substrate layers.

6. The circuit as defined by claim 5, further comprising several electrically insulating spacer boards disposed between adjacent substrate layers, said spacer boards including vertical conductors that comprise part of said vertical interconneect means.

7. An electronic circuit, comprising:
    a multiplicity of generally planar diamond substrate layers;
    a multiplicity of generally planar spacer boards;
    each of said substrate layers having mounted thereon:
        a multiplicity of electronic circuit elements, and conductive means for coupling between electronic circuit elements on the substrate;
    the substrate layers and spacer boards being stacked in alternating fashion so that spacer boards are interleaved between adjacent substrate layers;
    a multiplicity of conductive vias through each of a number of said substrate layers for vertical interconnection between circuit elements on different substrate layers;

each of said spacer boards having a multiplicity of electrical conductors extending through its planar thickness to effect coupling between electronic circuit elements and vias on the substrate layers on its opposing sides;

said substrate layers having apertures generally along their peripheries for receiving heat exchange liquid; and heat exchange liquid passing through said apertures.

8. The circuit as defined by claim 7, wherein at least some of the electronic circuit elements on said substrate layers comprise integrated circuit chips.

9. The circuit as defined by claim 8, wherein said substrate layers and spacer boards are generally rectangular in shape, and said stack of substrate layers and spacer boards is generally rectangaloid.

10. The circuit as defined by claim 8, wherein said substrate layers and spacer boards are generally square.

11. The circuit as defined by claim 10, wherein the height of said stack is about the same as the length and width dimension of said substrate layers and spacer boards, so that said stack has a generally cubic shape.

12. The circuit as defined by claim 8, further comprising means for coupling electrical power to said circuit.

13. The circuit as defined by claim 7, wherein at least some of said substrate layers include a conductive layer disposed on a surface of the substrate layer, the conductive layer including a tab portion which extends along the edge thickness of the substrate layer at a particular position on the periphery of the substrate layer, said particular position on said at least some of said substrate layers being in registration on said stack of substrate layers; and means for coupling a source of electrical power to the registered edge tabs.

14. The circuit as defined by claim 8, wherein at least some of said substrate layers include a conductive layer disposed on a surface of the substrate layer, the conductive layer including a tab portion which extends along the edge thickness of the substrate layer at a particular position on the periphery of the substrate layer, said particular position on said at least some of said substrate layers being in registration on said stack of substrate layers; and means for coupling a source of electrical power to the registered edge tabs.

15. The circuit as defined by claim 13, wherein said conductive layer is coupled with circuit elements on said at least some of said substrate layers.

16. The circuit as defined by claim 15, wherein said tab portions wrap around said edge thickness to the opposing side of said substrate layer, and further comprising electrical conductors which pass through the planar thickness of said substrate layers to connect the tab portion on opposing sides of the substrate layer.

17. The circuit as defined by claim 8, wherein said spacer boards are formed of an insulating material, and have a multiplicity of holes through their planar thickness, and conductors placed in selected one of the holes to effect electrical coupling between electrical elements on the substrate layers on opposing side of each spacer board.

18. The circuit as defined by claim 17, wherein said conductors in said holes are wadded conductive metal fibers.

19. The circuit as defined by claim 8, wherein said spacer boards include apertures for receiving said integrated circuit chips.

20. The circuit as defined by claim 8, wherein said integrated circuit chips are mounted on one side of said substrate layers, and further comprising alternating layers of conductors and insulator disposed on the other side of said substrate layers, at least some of said conductors being coupled with said integrated circuit chips by said conductive vias passing through said substrate layers.

21. The circuit as defined by claim 8, further comprising input/output signal interconnect means coupled to an end of said stack.

22. An electronic circuit, comprising:

a multiplicity of generally planar diamond substrate layers of thermally conductive and electrically insulating material;

a multiplicity of generally planar spacer boards of electrically insulating material;

each of said substrate layers having mounted thereon:
a multiplicity of electronic circuit elements, and
conductive means for coupling between electronic elements on the substrate;

the substrate layers and spacer boards being stacked in alternating fashion so that spacer boards are interleaved between adjacent substrate layers;

a multiplicity of conductive vias through each of a number of said substrate layers for vertical interconnection between circuit elements on different substrate layers;

each of said spacer boards having a multiplicity of electrical conductors comprising wadded conductive metal fibers, extending through holes in the spacer board to effect coupling between electronic circuit elements and vias on the substrate layers on its opposing sides; and means for coupling a heat exchanger generally along the peripheries of said substrate layers.

23. The circuit as defined by claim 22, wherein at least some of the electronic circuit elements on said substrate layers comprise integrated circuit chips.

24. The circuit as defined by claim 23, wherein said substrate layers have apertures generally along portions of their peripheries for receiving heat exchange fluid.

25. The circuit as defined by claim 23, wherein said substrate layers and spacer boards are generally rectangular in shape, and said stack of substrate layers and spacer boards is generally rectangaloid.

26. The circuit as defined by claim 23, wherein said substrate layers and spacer boards are generally square.

27. The circuit as defined by claim 26, wherein the height of said stack is about the same as the length and width dimension of said substrate layers and spacer boards, so that said stack has a generally cubic shape.

28. The circuit as defined by claim 23, further comprising means for coupling electrical power to said circuit.

29. The circuit as defined by claim 23, wherein at least some of said substrate layers include a conductive layer disposed on a surface of the substrate layer, the conductive layer including a tab portion which extends along the edge thickness of the substrate layer at a particular position on the periphery of the substrate layer, said particular position on said at least some of said substrate layers being in registration on said stack of substrate layers; and means for coupling a source of electrical power to the registered edge tabs.

30. The circuit as defined by claim 29, wherein said conductive layer is coupled with circuit elements on said at least some of said substrate layers.

31. The circuit as defined by claim 29, wherein said tab portions wrap around said edge thickness to the opposing side of said substrate layer, and further comprising electrical conductors which pass through the planar thickness of said substrate layers to connect the tab portion on opposing sides of the substrate layer.

32. The circuit as defined by claim 23, wherein said spacer boards include apertures for receiving said integrated circuit chips.

33. The circuit as defined by claim 23, wherein said integrated circuit chips ar mounted on one side of said substrate layers, and further comprising alternating layers of conductors and insulator disposed on the other side of said substrate layers, at least some of said conductors being coupled with said integrated circuit chips by said conductive vias passing through said substrate layers.

34. The circuit as defined by claim 23, further comprising input/output signal interconnect means coupled to an end of said stack.

35. A circuit comprising:
   a plurality of generally planar diamond substrate layers;
   electronic circuit elements mounted on each of said diamond substrate layers;
   said diamond substrate layers being disposed in a stack;
   electrically conductive horizontal interconnect means for coupling between circuit elements on individual substrate layers, and electrically conductive vertical interconnect means coupled through said substrate layers for coupling between circuit elements on different substrate layers; and
   moving liquid for contacting said substrate layers and carrying heat away from the peripheries of said substrate layers.

36. The circuit as defined by claim 35, wherein said plurality of diamond substrate layers comprises several diamond substrate layers, and wherein said vertical interconnect means comprise conductive vias which pass through substrate layers.

37. The circuit as defined by claim 35, wherein said electronic circuit elements mounted on each of said substrate layers comprises a multiplicity of circuit elements.

38. The circuit as defined by claim 36, wherein said electronic circuit elements mounted on each of said substrate layers comprises a multiplicity of circuit elements.

39. The circuit as defined by claim 37, wherein said electronic circuit elements comprise integrated circuit chips.

40. The circuit as defined by claim 38, wherein said electronic circuit elements comprise integrated circuit chips.

* * * * *